United States Patent
Kang et al.

(10) Patent No.: US 7,304,504 B2
(45) Date of Patent: Dec. 4, 2007

(54) OUTPUT DRIVER IN SEMICONDUCTOR DEVICE

(75) Inventors: Hee-Bok Kang, Kyoungki-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 87 days.

(21) Appl. No.: 11/255,739

(22) Filed: Oct. 21, 2005

(65) Prior Publication Data

US 2006/0197556 A1 Sep. 7, 2006

(30) Foreign Application Priority Data

Mar. 2, 2005 (KR) .................... 10-2005-0017399

(51) Int. Cl.
*H03K 19/094* (2006.01)
*H03K 19/0175* (2006.01)
(52) U.S. Cl. .................... 326/87; 326/27; 326/30
(58) Field of Classification Search .......... 326/26–27, 326/30, 87; 327/108, 112
See application file for complete search history.

(56) References Cited

U.S. PATENT DOCUMENTS

| | | | | |
|---|---|---|---|---|
| 5,568,068 | A | * | 10/1996 | Ota et al. .................... 326/82 |
| 5,621,335 | A | * | 4/1997 | Andresen .................... 326/30 |
| 2003/0016512 | A1 | | 1/2003 | McCall et al. |
| 2003/0223303 | A1 | | 12/2003 | Lamb et al. |
| 2004/0066683 | A1 | | 4/2004 | Hartmann et al. |

* cited by examiner

*Primary Examiner*—Anh Q. Tran
(74) *Attorney, Agent, or Firm*—Blakely, Sokoloff, Taylor & Zafman

(57) ABSTRACT

An output driver of a semiconductor device, removing the inter-symbol interference noise in data transmission in order to achieve a signal integrity, includes a main driver for driving an output terminal and a supporting driver for controlling the inter-symbol interference noise. The supporting driver is provided with a pull up supporting driver for pulling up the output terminal by detecting a transmission pattern of an output data and a pull down supporting driver for pulling down the output terminal by detecting the transmission pattern of the output data.

13 Claims, 9 Drawing Sheets

OUTPUT DRIVER IN SEMICONDUCTOR DEVICE

FIELD OF INVENTION

The present invention relates to an output driver in a semiconductor device; and, more particularly, to an output driver for removing an inter-symbol interference noise in a weak data transmission cycle during an asymmetric data pattern transmission in semiconductor device.

DESCRIPTION OF PRIOR ART

A semiconductor device is manufactured on the basis of general semiconductor fabrication methods such as a silicon wafer fabrication technology and a logic design technology. The end product based on the semiconductor fabrication method is a type of chip, e.g., a plastic package having plural logic gates and logic blocks for respectively performing various functions according to an application purpose. Most semiconductor chips are attached to a printed circuit board (PCB) and are supplied with an appropriate level of an operation voltage for operating the chip.

A semiconductor device such as a semiconductor memory device is operated in response to input and output signals for predetermined specific purposes. In other words, in accordance with a combination of the input signals, it is determined whether and how the semiconductor device will be operated. Meanwhile, an output signal of one semiconductor device is inputted to another semiconductor device in a same system as an input signal.

FIG. 1 is a schematic circuit diagram showing an I/O driver of a conventional semiconductor device.

As shown, the I/O driver 10 of the semiconductor device is provided with an input buffer 12 and an output driver 14. The input buffer 12 is for buffering and receiving an input signal from an external input terminal DQ. Generally, the input buffer 12 is implemented with a static input buffer or a differential amplifying input buffer. The output driver 14 drives an output data of the semiconductor device into a load coupled to the output terminal DQ through the output terminal DQ. The output driver 14 is usually implemented using a main driver in the form of a CMOS inverter provided with a pull up PMOS transistor and a pull down NMOS transistor. In some cases, a supporting driver is preceded by the main driver.

The output driver determines a voltage level and a slew rate of the output data. That is, if a swing level of the output data is too low, a noise margin is decreased; and if the swing level of the output data is too high, the noise margin is increased, but a problem such as a crosstalk is generated. Therefore, as the operation voltage of the semiconductor device becomes lowered, and an operation speed becomes raised, performance of the output driver becomes more important relative to keeping signal integrity.

FIG. 2 is a timing diagram showing an operation of the conventional output driver including the supporting driver and the main driver.

As shown in FIG. 2, in case of a symmetric data pattern transmission, which a low level and a high level of an output signal outputted from the output terminal DQ swing at equal levels, each data distortion in every cycle is uniform, and the output driver transmits a data pattern normally.

However, in case of an asymmetric data pattern transmission, when data of same logic level are continuously transmitted, the output signal from the output driver is distorted. For example, if the output driver transmits data of high logic level continuously, the level of output signal from the output driver become increased. Then, if a low level data is transmitted by the output driver when the output signal is increased in the above mentioned method, the level of the output signal cannot drop sufficiently to a voltage level of the low level data because of a slew rate determined by the main driver. Herein, the above mentioned phenomenon is called as an inter-symbol interference noise, and the low level data is called as a weak data. In a cycle for a weak data transmission, performance of the output driver to transmit data is deteriorated.

For the reference, the asymmetric data pattern transmission occurs when an operation speed of the semiconductor device, i.e., a clock frequency is remarkably rapid because the output driver outputs a data of a next clock before a former clock data reaches a top voltage level.

SUMMARY OF THE INVENTION

It is, therefore, an object of the present invention to provide an output driver of a semiconductor device which removes an inter-symbol interference noise in a weak data transmission cycle during not only a symmetric data transmission but also during an asymmetric data transmission.

In accordance with an aspect of the present invention, there is provided an output driver including a main driver for driving an output terminal and a supporting driver for driving the output terminal in response to a transmission pattern of an output data to control the inter-symbol interference noise. The supporting driver includes a pull up supporting driver for pulling up the output terminal by detecting a transmission pattern of an output data and a pull down supporting driver for pulling down the output terminal by detecting the transmission pattern of the output data.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, an output driver of a semiconductor device in accordance with the present invention will be described in detail referring to the accompanying drawings.

Figure 1:
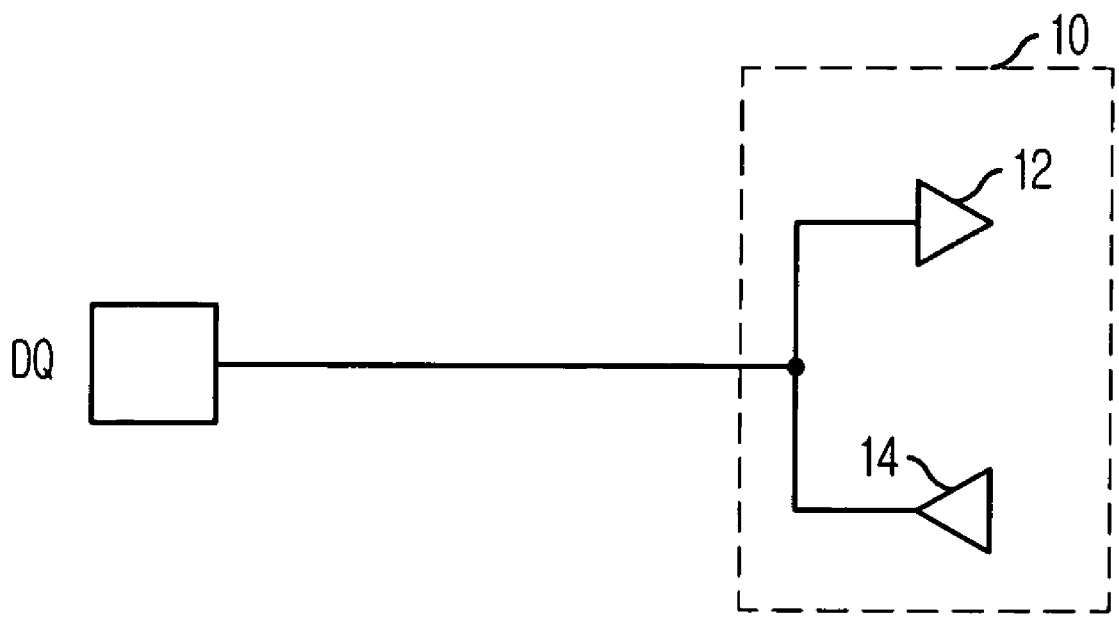
FIG. 1 is a schematic circuit diagram showing an I/O driver of a conventional semiconductor device.
Figure 2:
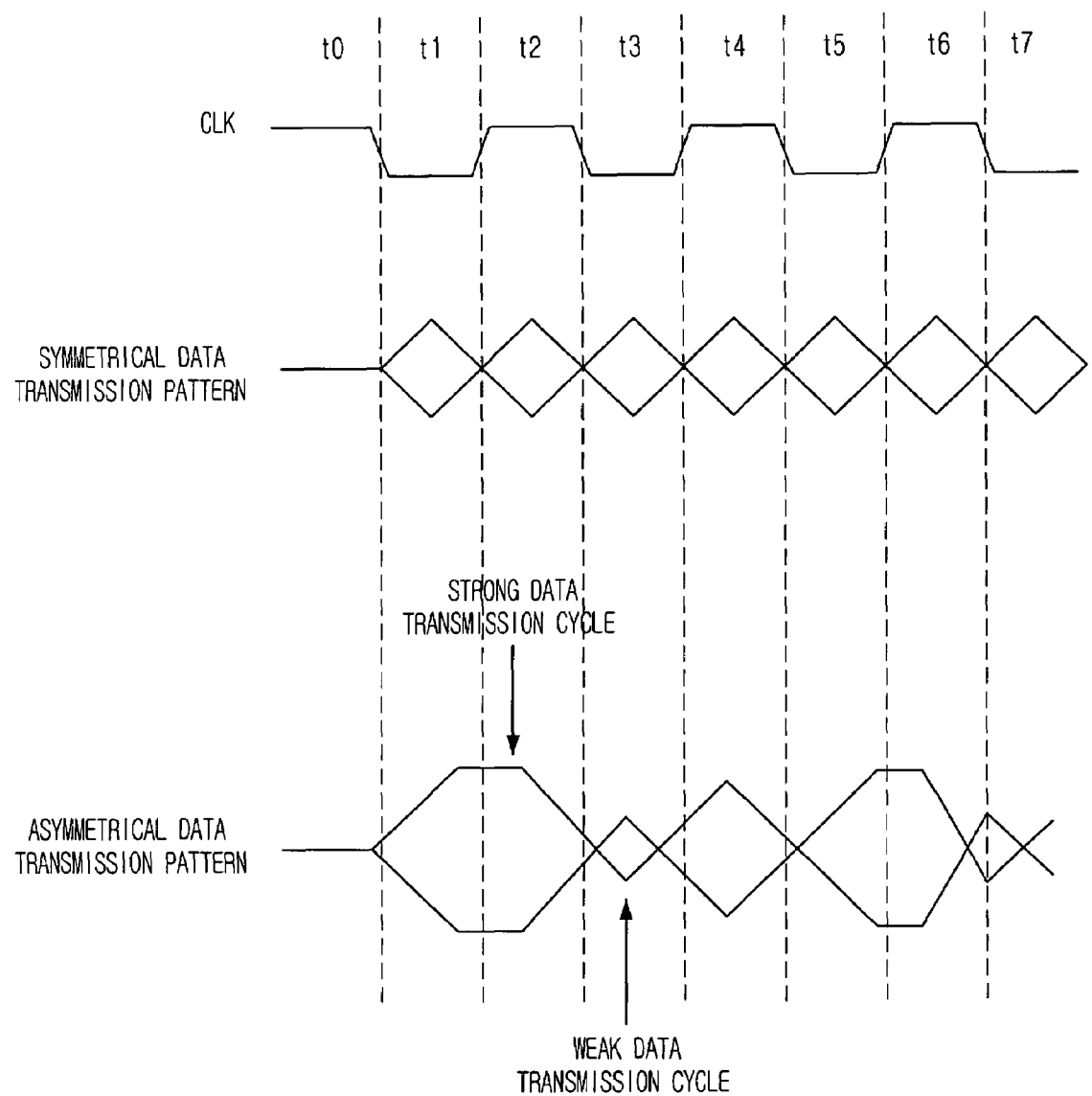
FIG. 2 is a timing diagram showing an operation of a conventional output driver including a supporting driver and a main driver.
Figure 3:
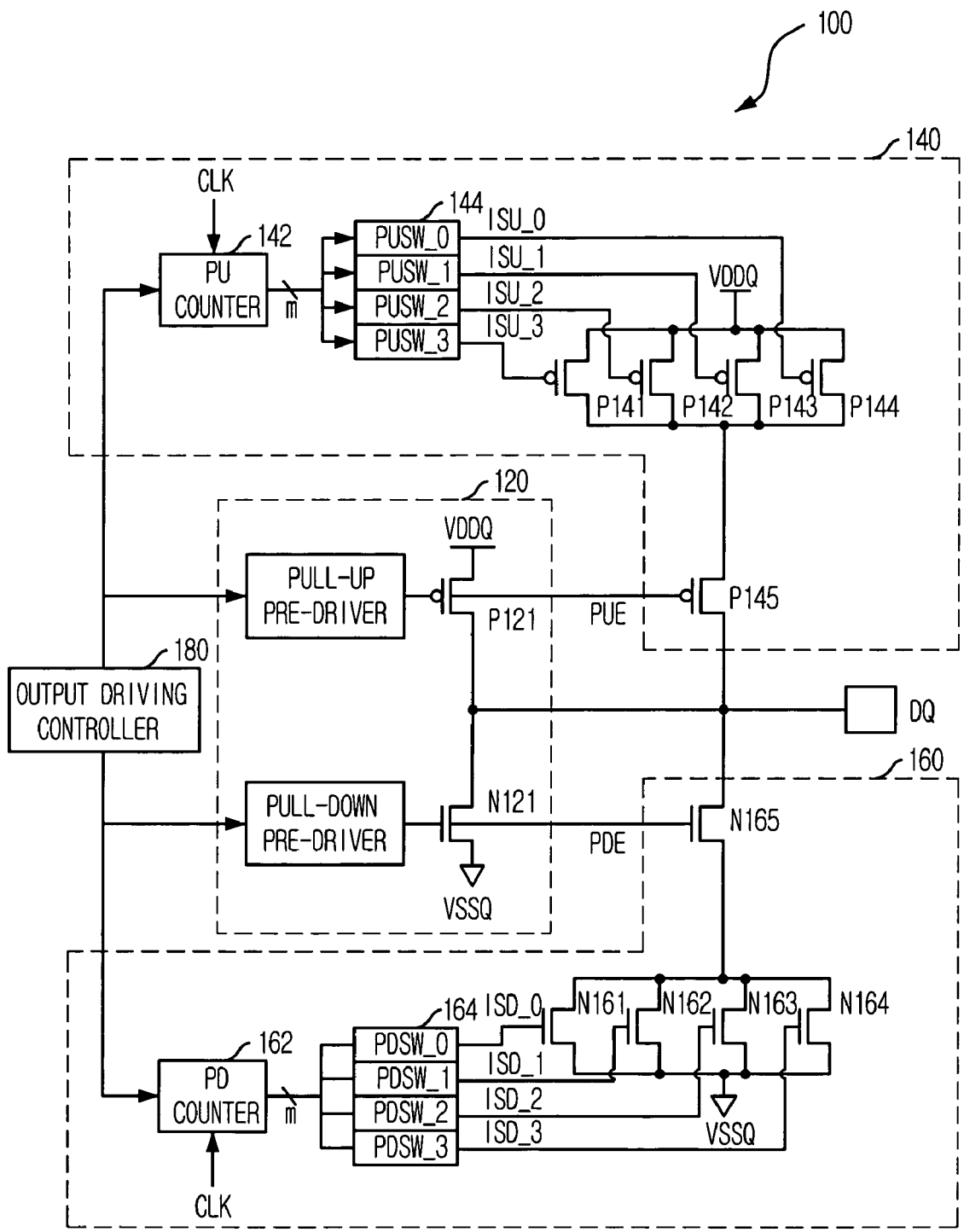
FIG. 3 is a block diagram of an output driver in accordance with a preferred embodiment of the present invention.

FIG. 3 is a block diagram of the output driver in accordance with a preferred embodiment of the present invention.

As shown, the output driver 100 is provided with a main driving block 120 for driving an output terminal DQ, two supporting driving blocks 140 and 160 for additionally driving the output terminal DQ, and an output driving controller 180.

The main driving block 120 drives an output terminal DQ in response to an output signal from the output driving controller 180. The two supporting driving blocks 140 and 160 incidentally drive the output terminal DQ in response to a transmitting pattern of the output data from the output driving controller 180 by controlling an inter-symbol interference noise.

Further, the main driving block 120 is constituted with a pull up pre-driver, a pull down pre-driver, a main PMOS transistor P121, and a main NMOS transistor N121.

The pull up pre-driver generates a pull up control signal PUE, and the pull down pre-driver generates a pull down control signal PDE in response to the output signal from the output driving controller 180. The main PMOS transistor P121 pulls up the output terminal DQ in response to the pull up control signal PUE, and the main NMOS transistor N121 pulls down the output terminal DQ in response to the pull down control signal PDE.

The pull up supporting driving block 140 is for reducing the inter-symbol interference noise by pulling up the output terminal DQ corresponding to a data transmission pattern.

The pull up supporting driving block 140 is provided with a pull up counter 142, a first decoder 144, a plurality of parallel connected driving PMOS transistors P141 to P144, and a supporting pull up driving PMOS transistor P145.

The pull up counter 142 counts a number of a low level data continuously outputted from the output driving controller 180. The first decoder 144 is for decoding an m-bit value outputted from the pull up counter 142. Herein, m is a natural number; and, in the embodiment shown in FIG. 3, m is 2. The plurality of driving PMOS transistors P141 to P144 receives decoded signals ISU_0 to ISU_3 from the first decoder 144 through gates respectively; and the PMOS transistors P141 to P144 are parallel connected to a power supply voltage terminal VDDQ. Herein, the driving PMOS transistors P141 to P144 are expected to be the same size. The supporting pull up driving PMOS transistor P145 is connected between the plurality of the driving PMOS transistors P141 to P144 and the output terminal DQ; and the pull up control signal PUE is inputted to a gate of transistor P145.

Also, the pull down supporting driving block 160 is for reducing the inter-symbol interference noise by pulling down the output terminal DQ in response to the data transmission pattern.

The pull down supporting driving block 160 is provided with a pull down counter 162, a second decoder 164, a plurality of NMOS transistors N161 to N164, and a supporting pull down driving NMOS transistor N165.

The pull down counter 162 counts the number of continuous high level data outputted from the output driving controller 180. The second decoder 164 decodes an m-bit value outputted by the pull down counter 162. The plurality of the driving NMOS transistors N161 to N164 receives decoded signals ISD_0 to ISD_3 through each of their gates respectively; and the NMOS transistors N161 to N164 are parallel connected to a ground voltage terminal VSSQ. Herein, the NMOS transistors N161 to N164 are expected to be the same size. The supporting pull down driving NMOS transistor N165 is connected between the plurality of the NMOS transistors N161 to N164 and the output terminal DQ; and the pull down control signal PDE is inputted to a gate of transistor N165.

Herein, the m is a natural value; and, in the embodiment shown in FIG. 3, m is 2. Therefore, the decoders 142 and 162 can count to four, i.e., '00' to '11'.

Meanwhile, the first decoder 144 is a 2×4 decoder and constituted with four switching blocks PUSW_0 to PUSW_3. Each switching block receives different 2-bit values outputted from the pull up counter 142.

Also, the second decoder 164 is a 2×4 decoder and constituted with four switching blocks PDSW_0 to PDSW_3. Each switching block receives different 2-bit values outputted from the pull down counter 162. Every switching block in the first decoder 142 and the second decoder 162 can be implemented with a NAND gates.

FIGS. 4 to 9 are timing diagrams showing operations in accordance with an asymmetric data transmission pattern of the output driver 100 shown in FIG. 3.

Hereinafter, referring to FIGS. 4 to 9, the operation of the output driver is explained.

Figure 4:
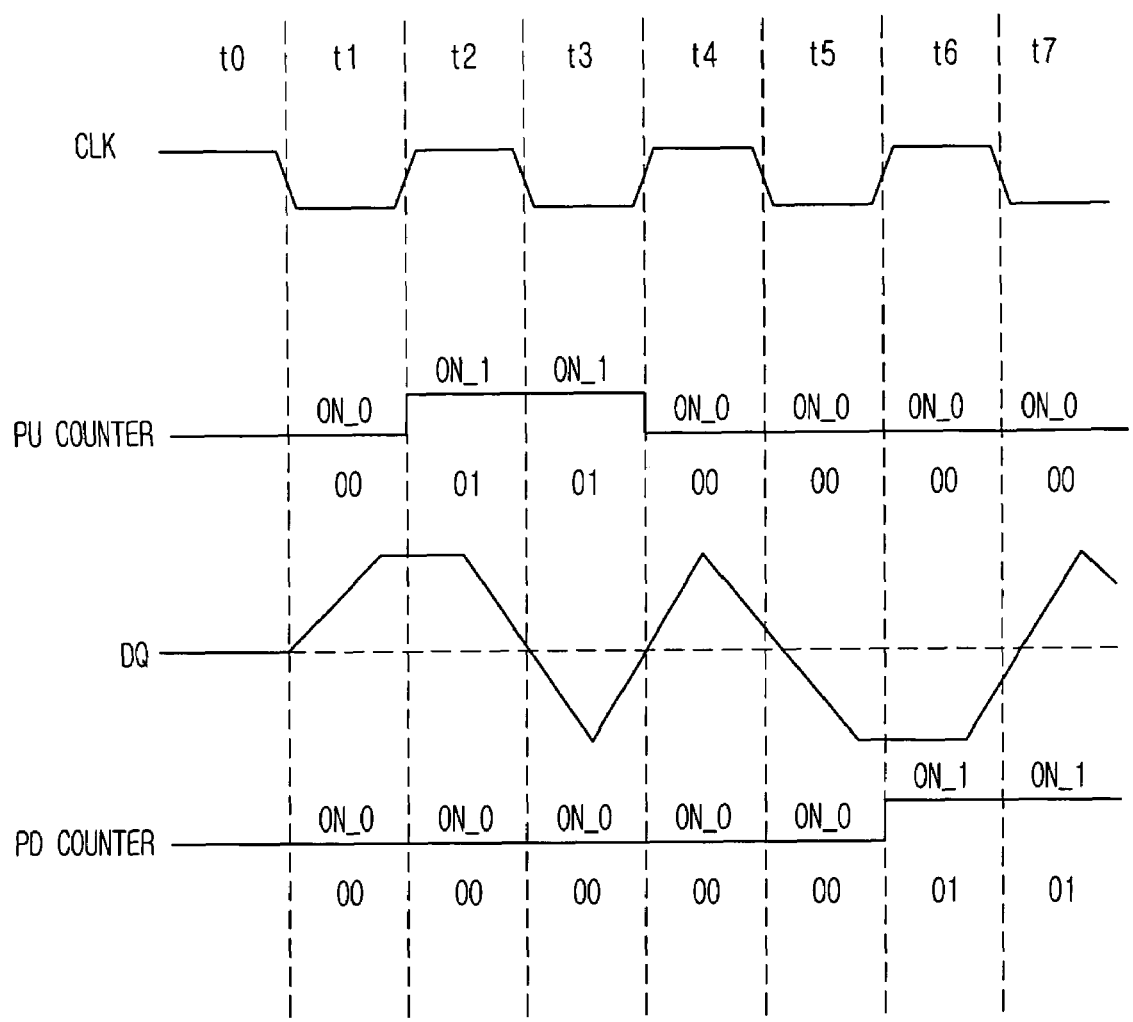
FIGS. 4 to 9 are timing diagrams showing operations in accordance with an asymmetric data transmission pattern of the output driver shown in FIG. 3.

Referring to FIG. 4, during t1 sector to t2 sector, high level data are transmitted continuously; during at3 sector, a low level data is transmitted; during a t4 sector, a high level data is transmitted; during t5 to t6 sectors, low level data are transmitted; and during a t7 sector, a high level data is transmitted. In other words, FIG. 4 shows an asymmetric data transmission pattern of continuously outputting two data of high logic levels and outputting one data of low logic level.

In the t1 sector, the pull up counter 142 and the pull down counter 162 are reset as '00' commonly, and the first decoded up signal ISU_0 and the first decoded down signal ISD_0 corresponding to '00' are activated so that the first decoded up signal ISU_0 has a logic level 'LOW' and the first decoded down signal ISD_0 has a logic level 'HIGH'. The other decoded signals from the decoders 144 and 164 are holding an inactivated state. Further, because the high level data is transmitted during the t1 sector, the main PMOS transistor P121 and the supporting pull up driving PMOS transistor P145 are turned-on. Also, the driving PMOS transistor P144 receiving the first decoded up signal ISU_0 through gate is turned-on. Accordingly, a current flows between the driving PMOS transistor P144 and the supporting pull up driving PMOS transistor P145.

Meanwhile, in the t2 sector, the pull down counter 162 performs the counting operation in response to the high level data continuously transmitted from the output driving controller 180. The pull up counter 142 holds the reset value, '00'. Therefore, the first and second decoded down signals ISD_0 and the ISD_1 have logic level 'HIGH', and the third and fourth decoded down signals ISD_2 and ISD_3 have logic level 'LOW'. The first decoded up signal ISU_0 has a logic level 'LOW', and the second to fourth decoded up signals ISU_1 to ISU_3 have logic level 'HIGH'.

The main PMOS transistor P121, the supporting pull up driving PMOS transistor P145, and the driving PMOS transistor P144 are turned-on. Therefore, the current flows between the supporting pull up driving PMOS transistor P145 and the driving PMOS transistor P144. In the pull down supporting driving block 160, the driving NMOS transistors N161 and N162 are turned-on.

In the t3 sector, a low level data is transmitted, and therefore, the pull down counter 162 stops the counting operation and holds '01' value. The pull up counter 142 keeps the reset state, i.e., '00'. Accordingly, the main NMOS transistor N121 and the supporting pull down driving NMOS transistor N165 are turned-on in response to the output signal of low level from the output driving controller 180. The driving NMOS transistors N161 and N162 are also turned-on, like the case shown in the t2 sector. Therefore, a current flows between the supporting pull down driving NMOS transistor N165 and driving NMOS transistors N161 and N162. Herein, because the two driving NMOS transistors N161 and N162 perform the pull down operation, a pull down driving strength and a slew rate of the output data are increased, as compared with a pull down driving strength of the conventional art. Accordingly, the output terminal DQ is pulled-down more rapidly and has a sufficient low level.

In the t4 sector, because a high level data is transmitted, the pull down counter 162 is reset to '00', and the pull up counter 142 holds the reset state as '00'. Accordingly, the driving PMOS transistor P144 of the pull up supporting driving block 140 and the driving NMOS transistor N161 of the pull down supporting driving block 160 are turned-on. Also, because the high level data is transmitted from the output driving controller 180, the main PMOS transistor P121 and the supporting pull up driving PMOS transistor P145 are turned-on. Therefore, a current flows between the driving PMOS transistor P144 and the supporting pull up driving PMOS transistor P145, like the case shown in the t1 sector.

In the t5 sector, a low level data is transmitted from the output driving controller 180. Therefore, the two counters 142 and 162 hold the reset state, '00' so that the main NMOS transistor N121 and the supporting pull down driving NMOS transistor N165 are turned-on. In the pull down supporting driving block 160, the driving NMOS transistor N161 is turned-on in response to the ISD_0. Then, a current flows between the driving NMOS transistor N161 and the supporting pull down NMOS transistor N165.

Meanwhile, in the t6 sector, a low level data is transmitted continuously and, consequently, the pull up counter 142 performs a counting operation. However, the pull down counter 162 holds the reset state, '00'. The first and second decoded up signals ISU_0 and ISU_1 have logic level 'LOW', and the third and fourth decoded up signals ISU_2 and ISU_3 have logic level 'HIGH'. The first decoded down signal ISD_0 has a logic level 'HIGH' and the second to fourth decoded down signals ISD_1 to ISD_3 have logic level 'LOW'. The main NMOS transistor N121 and the supporting pull down driving NMOS transistor N165 are turned-on in response to the low level data transmitted from the output driving controller 180. The driving NMOS transistor N161 is turned-on in response to the first decoded down signal ISD_0. Then, a current flows between the driving NMOS transistor N161 and the supporting pull down driving NMOS transistor N165. Further, in the pull up supporting driving block 140, the driving PMOS transistors P143 and P144 are turned-on in response to the second and first decoded up signals ISU_1 and ISU_0, respectively.

In the t7 sector, as a high level data is transmitted, the pull up counter 142 stops the counting operation and holds '01'. Meanwhile, the pull down counter 162 holds the reset state, '00'. The main PMOS transistor P121 and the supporting pull up driving PMOS transistor p145 are turned-on in response to the high level data. The driving PMOS transistors P143 and P144 of the pull up supporting driving block 140 are turned-on. Accordingly, a current flows between the supporting pull up PMOS transistor 145 and the driving PMOS transistors P143 and P144. Because the pull up operation is performed by the two transistors P143 and the P144, a pull up driving strength for the output terminal DQ is increased, as compared with that of the conventional output driver. Further, the slew rate of the output data is also increased. Therefore, a voltage level of the output terminal DQ is increased more rapidly and, thus, an output data can be outputted as sufficiently high level.

Putting the above mentioned blocks together, the pull up counter 142 counts the number of low level data continuously transmitted, and the pull down counter 162 counts the number of high level data continuously transmitted. Therefore, in an initial state, i.e., in the t1 sector and when transmitting a discontinuous data pattern, the counters 142 and 162 hold the reset state.

Further, if two same logic level data are transmitted continuously, the two driving transistors in the corresponding supporting driving blocks 140 and 160 are turned-on. In the same way, if three same logic level data are transmitted continuously, the three driving transistors in the corresponding supporting driving block are turned-on; if four same logic level data are transmitted continuously, the four driving transistors in corresponding supporting driving block are turned-on.

Meanwhile, referring to FIG. 3, a maximum value that the counters 142 and 162 can count is determined by the bit-number, m. For example, because m is 2 in the embodiment shown in FIG. 3, each of the counters 142 and 162 can count from zero to four. Accordingly, if same logic level data are transmitted continuously more than four times, the counters 142 and 162 hold '11', and the four driving transistors in the corresponding supporting driving block are turned-on.

If an opposite logic level data is transmitted in one sector after same logic level data are transmitted continuously, the counters 142 and 162 keep the same state with the state in the former sector during the corresponding sector, and then, in next sector, the counters 142 and 162 are reset.

That is, the number of the driving transistors turned-on is determined by the counters 142 and 162.

Table 1 shows operation states of the two supporting driving blocks 140 and 160 in response to the state of the counters 142 and 162.

TABLE 1

|  | PULL UP SUPPORTING DRIVING BLOCK | PULL DOWN SUPPORTING DRIVING BLOCK |
| --- | --- | --- |
| ON_0 | ISU_0 = LOW, ISU_1/2/3 = HIGH | ISD_0 = HIGH, ISD_1/2/3 = LOW |
| ON_1 | ISU_0/1 = LOW, ISU_2/3 = HIGH | ISD_0/1 = HIGH, ISD_2/3 = LOW |
| ON_2 | ISU_0/1/2 = LOW, ISU_3 = HIGH | ISD_0/1/2 = HIGH, ISD_3 = LOW |
| ON_3 | ISU_0/1/2/3 = LOW | ISD_0/1/2/3 = HIGH |

Herein, the ON_0 to ON_3 denote states of the driving transistors. For example, ON_0 denotes a state that one driving transistor in corresponding supporting driving blocks 140 and 160 is turned-on. Similarly, the ON_3 denotes a state that four driving transistors in corresponding supporting driving blocks 140 and 160 are turned-on.

Figure 5:
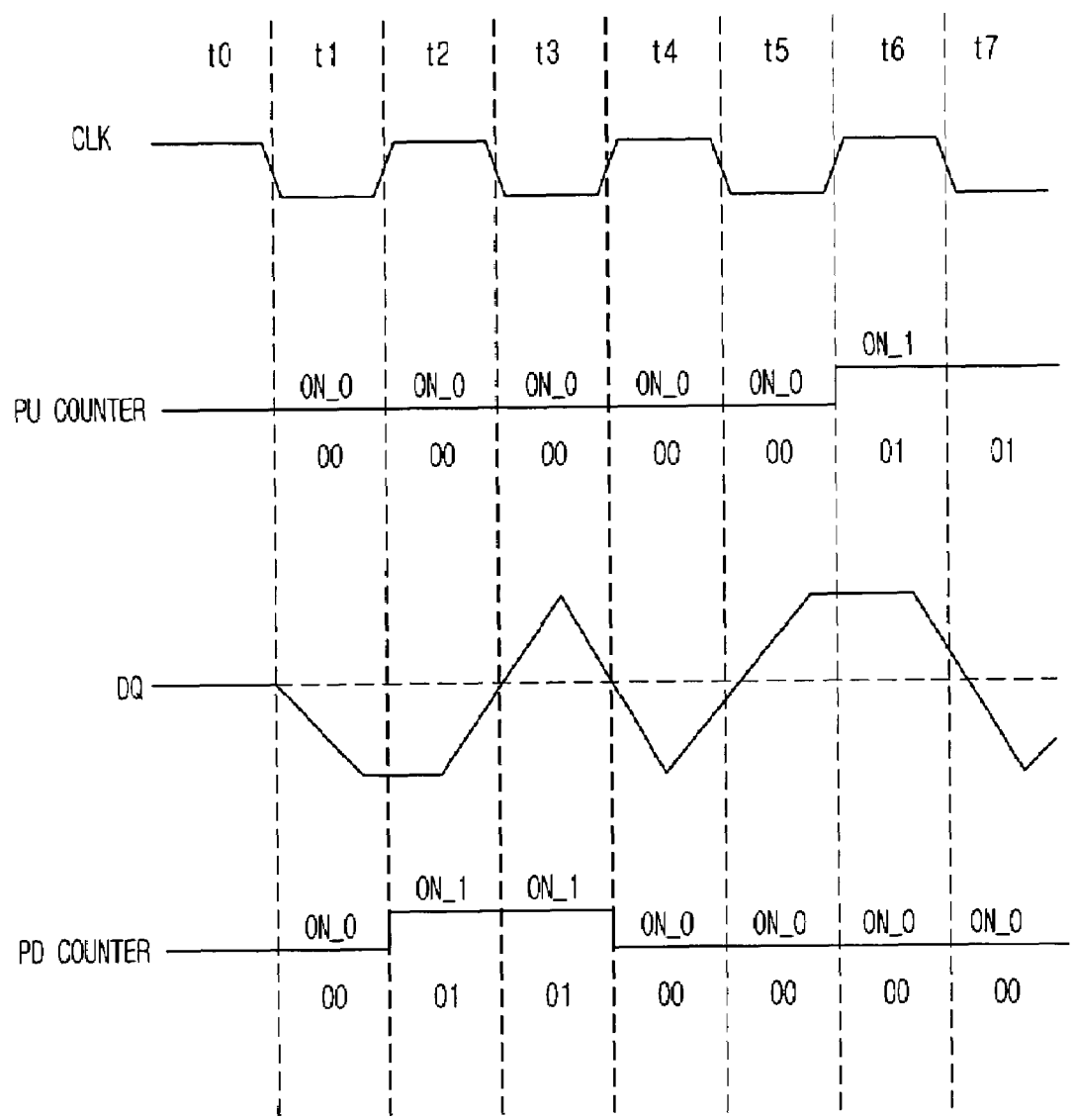

Next, FIG. 5 shows another type of an asymmetric data transmission pattern. That is, during t1 sector and t2 sector, two low level data are transmitted continuously; a high level data is transmitted in the t3 sector; a low level data is transmitted in the t4 sector; two high level data are transmitted continuously during the t5 and the t6 sectors; finally, a low level data is transmitted in the t7 sector. Comparing to FIG. 4, the counters 142 and 162 are operated in opposite sequence, and a wave form of the output terminal DQ has opposite form with those of FIG. 4.

Figure 6:
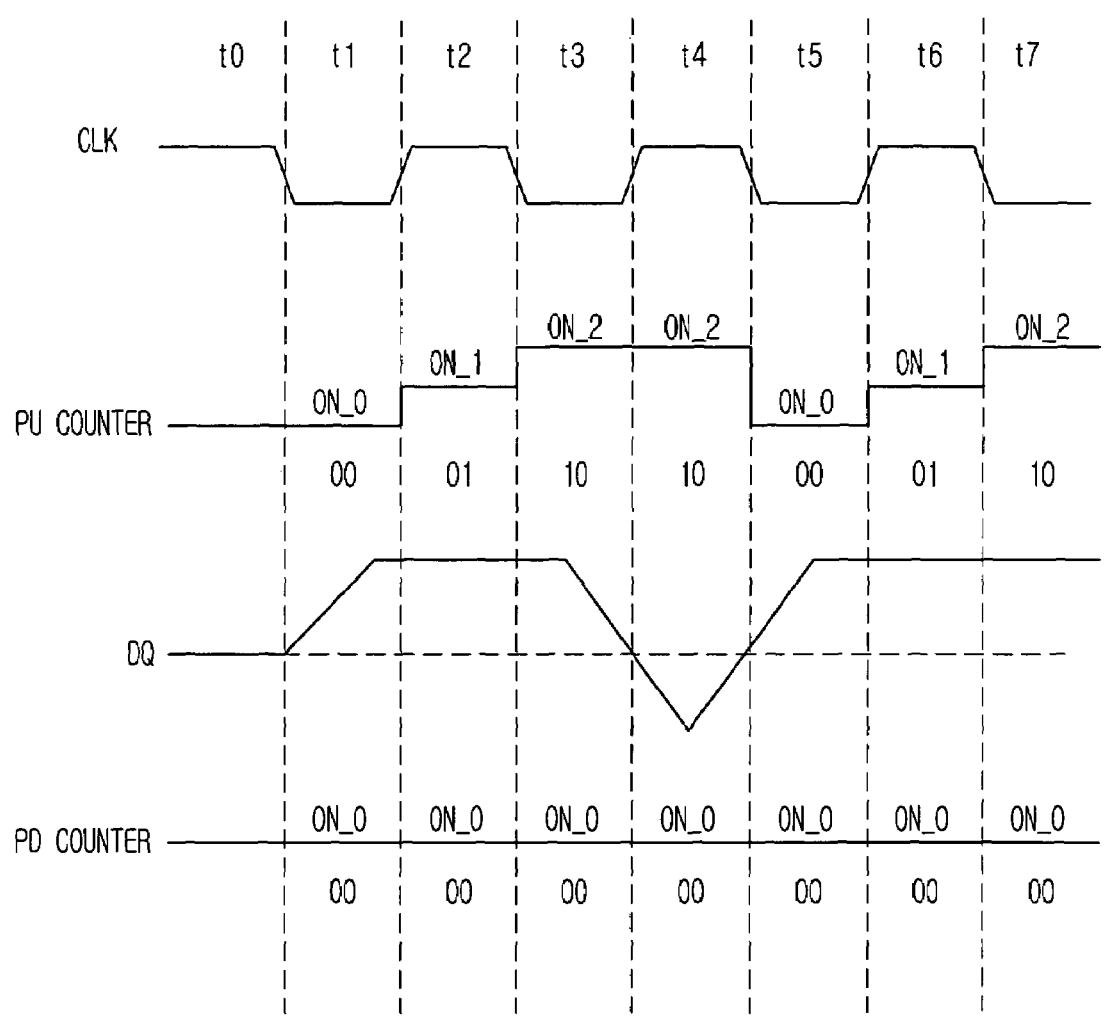

In FIG. 6, during first three sectors, i.e., the t1 to the t3 sectors, high level data are transmitted continuously; a low level data is transmitted in the t4 sector; during the last three sectors, i.e., the t5 to the t7 sectors, high level data are transmitted continuously once more. In this case, the pull down counter 162 performs a counting operation over the t2 and the t3 sectors, and three driving NMOS transistors N161, N162, and N163 are turned-on. Then, the three driving NMOS transistors are used for controlling the inter-symbol interference noise in the t4 sector. In the t5 sector, the pull down counter 162 is reset, and during the t6 to the t7 sectors performs the counting operation.

Figure 7:
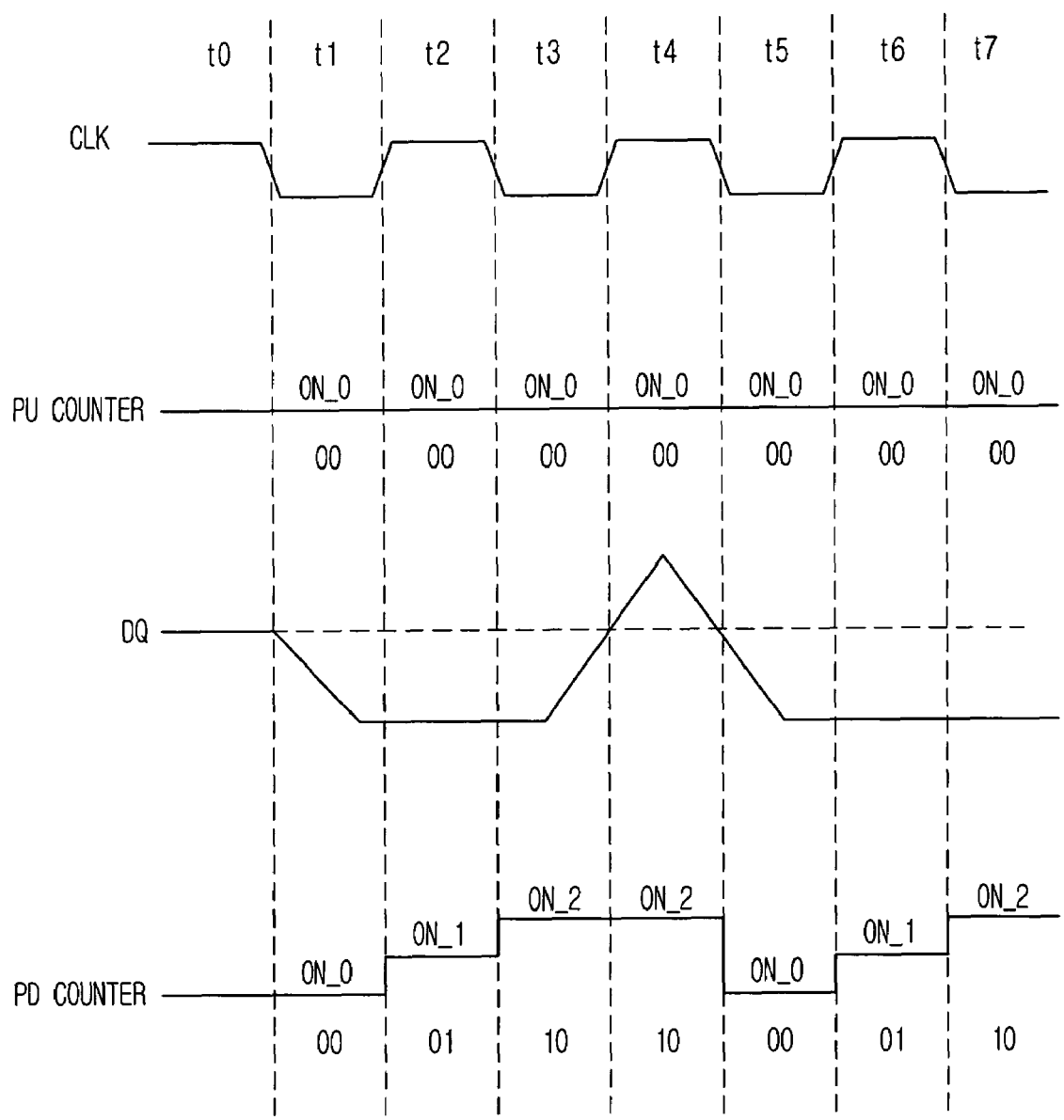

FIG. 7 shows another asymmetric data transmission pattern. In the t1 to the t3 sectors, low level data are transmitted; in the t4 sector, a high data is transmitted; and in the t5 to the t7 sectors, again, low level data are transmitted. Comparing with a case of FIG. 6, the counters 142 and 162 perform opposite operations, and a waveform of the output terminal DQ have an opposite form with that of FIG. 6.

Figure 8:
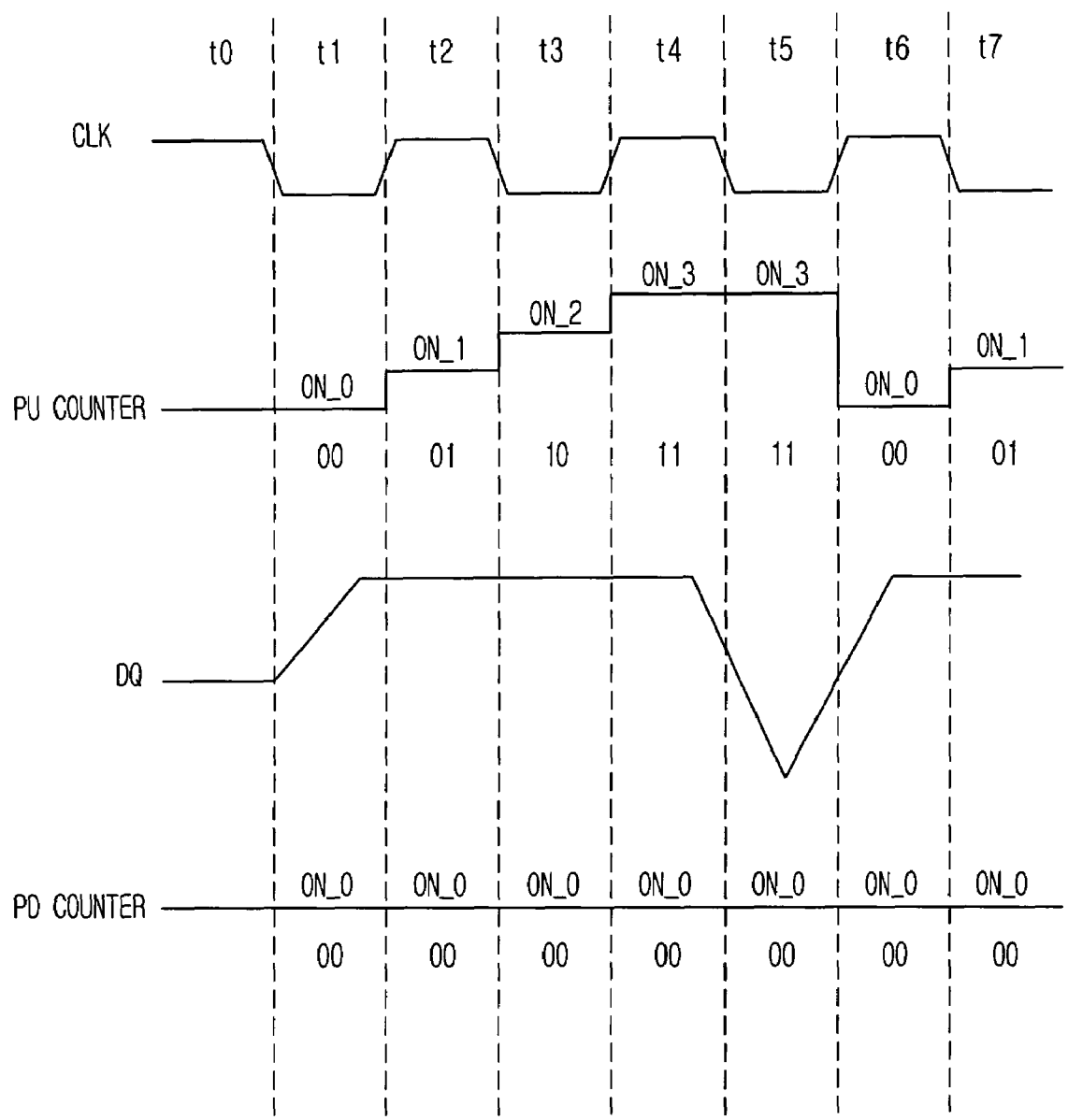

In FIG. 8, in the t1 to the t4 sectors, high level data are transmitted; low level data is transmitted in the t5 sector; and in the t6 and the t7 sectors, again, high level data are transmitted. Accordingly, the pull down counter 162 performs a counting operation during the t2 to the t4 sectors, and the driving NMOS transistors N161 to N164 are turned-on. During the t5 sector, the turned-on driving NMOS transistors N161 to N164 perform the pull down operation in order to control the inter-symbol interference noise. In the t6 sector, the pull down counter 162 is reset, and in the t7 sector, start performing count operation.

Figure 9:
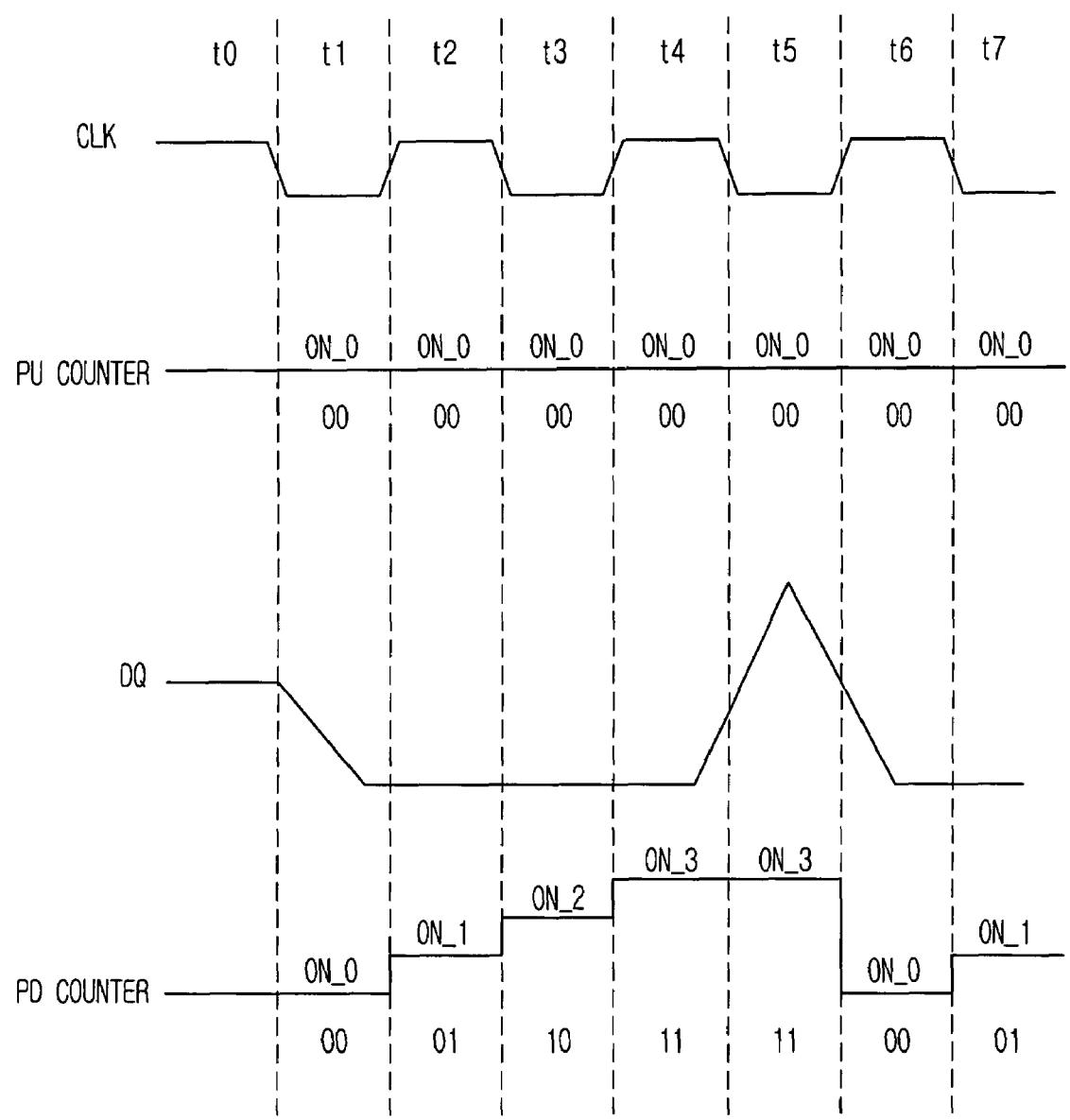

In FIG. 9, low level data are transmitted in the t1 to the t4 sectors; in the t5 sector, low level data is transmitted; in the t6 to the t7 sectors, high level data are transmitted. The counters 142 and 162 perform opposite operations, and a wave form of the output terminal DQ have opposite form with that of FIG. 8.

In abovementioned embodiment, the present invention uses the four driving PMOS transistors P161 to P164 in the pull up supporting driving block 140 and the four NMOS transistors N161 to N164 in the pull down supporting driving block 160. However, in another embodiment, it is possible to use various combinations of transistors in supporting driving block. In other words, the number and type of transistors can be varied as required.

Further, in the abovementioned embodiment, the output data from the output driving controller 180 are used to detect a data transmission pattern. However, the present invention can use any data which has logic high and logic low level such as pull up and pull down control signal, instead of the output data from the output driving controller 180.

The present invention make it possible for the data in weak data transmission cycles to have sufficient data level by increasing a driving power in a former strong data transmission cycle in advance. Therefore, the present invention removes the inter-symbol interference noise in data transmission and achieves a signal integrity.

The present application contains subject matter related to Korean patent application No. 2005-17399, filed in the Korean Patent Office on Mar. 02, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An output driver of a semiconductor device, comprising:
   a main driving means for driving an output terminal in response to a pull up control signal and a pull down control signal; and
   a supporting driving means for driving in auxiliary the output terminal in response to a transmission pattern of output data,
   wherein the supporting driving means includes;
   a pull up driver for pulling up the output terminal in response to the pull up control signal;
   a first driving block for driving a current flowing through the pull up driver in response to the transmission pattern of the output data;
   a pull down driver for pulling down the output terminal in response to the pull down control signal; and
   a second driving block for driving a current flowing through the pull down driver in response to the transmission pattern of the output data.

2. The output driver as recited in claim 1, wherein the main driving means includes:
   a main pull up driver for pulling up the output terminal in response to the pull up control signal; and
   a main pull down driver for pulling down the output terminal in response to the pull down control signal.

3. The output driver as recited in claim 1 wherein the supporting driving means further includes:
   a first counting block for counting the number of the output data having a low level data transmitted continuously to output a first counted value;
   a first decoding block for decoding the first counted value outputted from the first counting block;
   wherein the first driving block drives the pull up driver in response to an output signal of the first decoding block.

4. The output driver as recited in claim 3, wherein the supporting driving means further includes:
   a second counting block for counting a the number of the output data having a high level data transmitted continuously to output a second counted value;
   a second decoding block for decoding the second counted value outputted from the second counting block;
   wherein the second driving block drives the pull down driver in response to an output signal of the second decoding block.

5. The output driver as recited in claim 4, wherein the first driving block includes a plurality of driving PMOS transistors, each having a gate, said PMOS transistors parallel connected in parallel between a power supply voltage terminal and the pull up driver, and receiving the output signal from the first decoding block through the respective gates of said PMOS transistors.

6. The output driver as recited in claim 5, wherein the second driving block includes a plurality of driving NMOS transistors, each having a gate, said NMOS transistor connected in parallel between a ground voltage terminal and the pull down driver, and receiving the output signal from the second decoding block through the respective gates of said NMOS transistors.

7. The output driver as recited in claim 6, wherein the first counting block is reset in a next cycle of a cycle where the high level data is transmitted.

8. The output driver as recited in claim 7, wherein the second counting block is reset in a next cycle of a cycle where the low level data is transmitted.

9. An output driver of a semiconductor device, comprising:

a main driving means for driving an output terminal in response to a pull up control signal and a null down control signal; and a pull up supporting driving means for pulling up in auxiliary the output terminal by detecting an up transmission pattern of output data, wherein the up transmission pattern is a data pattern changing from a logic level 'L' to a logic level 'H', wherein the pull up supporting driving means includes:

a pull up driver for pulling up the output terminal in response to the pull up control signal;

a driving block for driving a current flowing through the pull up driver in response to the up transmission pattern of the output data.

10. The output driver as recited in claim 9, wherein the main driving means includes:

a pull up pre-driver for generating the pull up control signal by pre-driving the output data;

a pull down pre-driver for generating the pull down control signal by pre-driving the output data;

a main pull up driver for pulling up the output terminal in response to the pull up control signal; and a main pull down driver for pulling down the output terminal in response to the pull down control signal.

11. An output driver of a semiconductor device, comprising:

a main driving means for driving an output terminal in response to a pull up control signal and a pull down control signal; and a pull down supporting driving means for pulling down in auxiliary the output terminal by detecting a down transmission pattern of an output data to thereby control an inter-symbol interference, wherein the down transmission pattern is a data pattern changing from a logic level 'H' to a logic level 'L', wherein the pull down supporting driving means includes:

a pull down driver for pulling down the output terminal in response to the pull down control signal;

a driving block for driving a current flowing through the pull down driver in response to the down transmission pattern of the output data.

12. The output driver as recited in claim 11, wherein the main driving means includes:

a pull up pre-driver for generating the pull up control signal by pre-driving the output data;

a pull down pre-driver for generating the pull down control signal by pre-driving the output data;

a main pull up driver for pulling up the output terminal in response to the pull up control signal; and a main pull down driver for pulling down the output terminal in response to the pull down control signal.

13. The output driver as recited in claim 2, wherein the main driving means further includes:

a pull up pre-driver for generating the pull up control signal by pre-driving the output data; and a pull down pre-driver for generating the pull down control signal by pre-driving the output data.

* * * * *

UNITED STATES PATENT AND TRADEMARK OFFICE
CERTIFICATE OF CORRECTION

PATENT NO. : 7,304,504 B2  Page 1 of 1
APPLICATION NO. : 11/255739
DATED : December 4, 2007
INVENTOR(S) : Hee-Bok Kange and Jin-Hong Ahn It is certified that error appears in the above-identified patent and that said Letters Patent is hereby corrected as shown below:

In Column 8, claim 4, line 38, please delete "a"

In Column 8, claim 5, line 48, please delete "parallel"

In Column 9, claim 9, line 2, please delete "null" and insert -- "pull" --

Signed and Sealed this

Thirtieth Day of June, 2009

JOHN DOLL
*Acting Director of the United States Patent and Trademark Office*